(12) United States Patent
Kuo et al.

(10) Patent No.: US 8,567,978 B2
(45) Date of Patent: Oct. 29, 2013

(54) BACKLIGHT MODULE HAVING A LIGHT GUIDE PLATE AND A HEAT DISSIPATION FRAME AND DISPLAY APPARATUS HAVING THE SAME

(75) Inventors: Yicheng Kuo, Shenzhen (CN); Pangling Zhang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 256 days.

(21) Appl. No.: 13/123,971

(22) PCT Filed: Mar. 10, 2011

(86) PCT No.: PCT/CN2011/071705
§ 371 (c)(1),
(2), (4) Date: Apr. 13, 2011

(87) PCT Pub. No.: WO2012/109806
PCT Pub. Date: Aug. 23, 2012

(65) Prior Publication Data
US 2012/0212935 A1    Aug. 23, 2012

(30) Foreign Application Priority Data
Feb. 18, 2011    (CN) .......................... 2011 1 0041325

(51) Int. Cl.
*G02F 1/13357*    (2006.01)
*F21V 7/04*    (2006.01)

(52) U.S. Cl.
USPC ........................... 362/97.1; 362/345; 362/628

(58) Field of Classification Search
USPC ............ 349/62, 64; 362/97.1–97.4, 294, 345, 362/373, 612, 615, 616, 628
See application file for complete search history.

(56) References Cited

U.S. PATENT DOCUMENTS

| | | | |
|---|---|---|---|
| 2006/0221638 A1* | 10/2006 | Chew et al. | 362/613 |
| 2007/0120109 A1 | 5/2007 | Mizuyoshi | |
| 2009/0284956 A1* | 11/2009 | Gomi et al. | 362/97.3 |
| 2009/0316432 A1* | 12/2009 | Nittou | 362/612 |
| 2010/0002169 A1* | 1/2010 | Kuramitsu et al. | 349/65 |

FOREIGN PATENT DOCUMENTS

| | | |
|---|---|---|
| CN | 101128696 A | 2/2008 |
| CN | 201382341 Y | 1/2010 |
| CN | 101655634 A | 2/2010 |
| CN | 101807379 A | 8/2010 |
| CN | 201606739 U | 10/2010 |
| JP | 2009158210 A | 7/2009 |
| WO | WO 2006/004160 A1 | 1/2006 |

* cited by examiner

*Primary Examiner* — Nimeshkumar Patel
*Assistant Examiner* — Steven Horikoshi
(74) *Attorney, Agent, or Firm* — Ditthavong Mori & Steiner, P.C.

(57) ABSTRACT

The present invention provides a backlight module. The backlight module comprises a back bezel, at least one light source, a light guide plate and a heat dissipation frame. The light source is disposed in a recess of the light guide plate. The heat dissipation frame is configured to support the light guide plate and the light source, and to dissipate the heat of the light guide plate and the light source. The back bezel is configured to carry the light guide plate, the light source and the heat dissipation frame. The invention can improve the heat dissipation effect of the backlight module.

14 Claims, 2 Drawing Sheets

US 8,567,978 B2

BACKLIGHT MODULE HAVING A LIGHT GUIDE PLATE AND A HEAT DISSIPATION FRAME AND DISPLAY APPARATUS HAVING THE SAME

FIELD OF THE INVENTION

The present invention relates to a backlight module and a display apparatus, and more particularly to a backlight module and a display apparatus with great heat dissipation effect.

BACKGROUND OF THE INVENTION

Liquid crystal displays (LCDs) have been widely applied in electrical products. Currently, most of LCDs are backlight type LCDs, and comprise a liquid crystal panel and a backlight module. According to the position of the light source, the backlight module can be classified into a side-light type or a direct-light type, in order to provide LCDs with backlight sources.

The heat generated by the LCDs which is in working status may affect the efficiency thereof, and thus the heat dissipation thereof is very important. In the side-light type backlight module, the light source is disposed at one side of a light guide plate. In general, for lighting and thinning the backlight module, a heat sink strip of the light source is small, thereby deteriorating a heat dissipation effect of the backlight module.

SUMMARY OF THE INVENTION

A primary object of the present invention is to provide a backlight module comprising at least one light source; a light guide plate disposed including a light output surface and a bottom surface opposite to the light out surface, wherein the bottom surface of the light guide plate has a recess, and the light source is disposed in the recess; a heat dissipation frame configured to support the light guide plate and the light source, and to dissipate the heat of the light guide plate and the light source; and a back bezel configured to carry the light guide plate, the light source and the heat dissipation frame.

A secondary object of the present invention is to provide a display apparatus, wherein the display apparatus comprises a display panel and a backlight module. The backlight module comprises: at least one light source; a light guide plate disposed including a light output surface and a bottom surface opposite to the light out surface, wherein the bottom surface of the light guide plate has a recess, and the light source is disposed in the recess; a heat dissipation frame configured to support the light guide plate and the light source, and to dissipate the heat of the light guide plate and the light source; and a back bezel configured to carry the light guide plate, the light source and the heat dissipation frame.

A further object of the present invention is to provide a backlight module comprising: at least one light source; a light guide plate disposed including a light output surface and a bottom surface opposite to the light output surface, wherein the bottom surface of the light guide plate has a recess, and the light source is disposed in the recess, and the bottom surface is separated into two symmetrical inclined surfaces by the recess; a heat dissipation frame including a heat dissipation base and two heat dissipation plates, wherein the heat dissipation base is disposed corresponding to the recess for supporting the light source and dissipating the heat of the light source, and the heat dissipation plates are disposed at two opposite sides of the heat dissipation base for supporting the light guide plate and dissipating the heat of the light guide plate, and the heat dissipation plates are two inclined plates parallel to the bottom surface of the light guide plate; and a back bezel configured to carry the light guide plate, the light source and the heat dissipation frame.

In one embodiment of the present invention, the heat dissipation frame includes a heat dissipation base and two heat dissipation plates, and the heat dissipation base is disposed corresponding to the recess, and the heat dissipation plates are disposed at two opposite sides of the heat dissipation base.

In one embodiment of the present invention, the heat dissipation base and the heat dissipation plates are made of a metal material with great thermal conductivity.

In one embodiment of the present invention, the backlight module comprises two light sources. The two light sources are disposed at two opposite sides of the heat dissipation base.

In one embodiment of the present invention, the backlight module comprises three light sources. The three light sources are disposed at two opposite sides and a top surface of the heat dissipation base.

In one embodiment of the present invention, a reflective layer or a reflective sheet is disposed on the bottom surface at both sides of the recess.

In one embodiment of the present invention, the heat dissipation frame further includes a plurality of heat sinks disposed on a side surface of the heat dissipation plates and adjacent to the back bezel.

In one embodiment of the present invention, the backlight module further comprise a heat radiator disposed on the bottom surface of the back bezel and corresponding to heat dissipation base.

In comparison with the conventional technique, the light sources of the backlight module are disposed in the recess of the light guide plate, and thus the inner surface of the recess can be used to enlarge the area of the heat dissipation base for enlarging the heat dissipation area of the light sources. Moreover, the heat dissipation frame can conduct the heat of the light guide plate, and thus the backlight module of the present invention can have great heat dissipation effect. By improving the heat dissipation effect, the life time of the back-light sources can be extended, and the display quality of the display apparatus can be improved.

The structure and the technical means adopted by the present invention to achieve the above and other objects can be best understood by referring to the following detailed description of the preferred embodiments and the accompanying drawings:

DETAILED DESCRIPTION OF THE PREFERRED EMBODIMENTS

Figure 1:
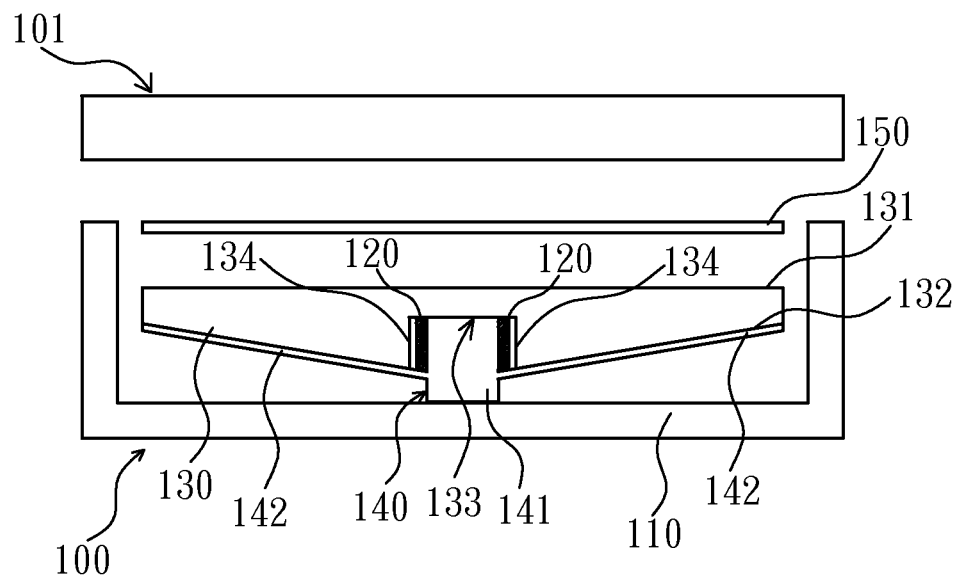
FIG. 1 is a cross-sectional view showing a backlight module and a display panel according to a first embodiment of the present invention.

The following embodiments are exemplified by referring to the accompanying drawings, for describing specific embodiments implemented by the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, like reference numerals indicate like components or items.

Referring to FIG. 1, FIG. 1 is a cross-sectional view showing a backlight module and a display panel according to a first embodiment of the present invention. The backlight module 100 of the present embodiment may be disposed below the display panel (such as a liquid crystal display panel), thereby forming a display apparatus (such as an LCD apparatus). The backlight module 100 comprises a back bezel 110, two light sources 120, a light guide plate 130, a heat dissipation frame 140 and an optical film assembly 150. The back bezel 110 is configured to carry the light sources 120, the light guide plate 130, the heat dissipation frame 140 and the optical film assembly 150. The heat dissipation frame 140 is disposed on the back bezel 110, and the light guide plate 130 is disposed on the heat dissipation frame 140. The light sources 120 are disposed between the heat dissipation frame 140 and the light guide plate 130. The optical film assembly 150 is disposed above the light guide plate 130 for optical improvement.

The back bezel 110 may be made of an opaque material, such as plastic, metal or any combination material thereof. The light sources 120 may be light bars with a plurality of light emitting diodes (LEDs). The light guide plate 130 may made of photo-curable resin, polymethylmethacrylate (PMMA) or polycarbonate (PC) for guiding the light of light sources 120 toward the liquid crystal display panel 101.

Figure 2:
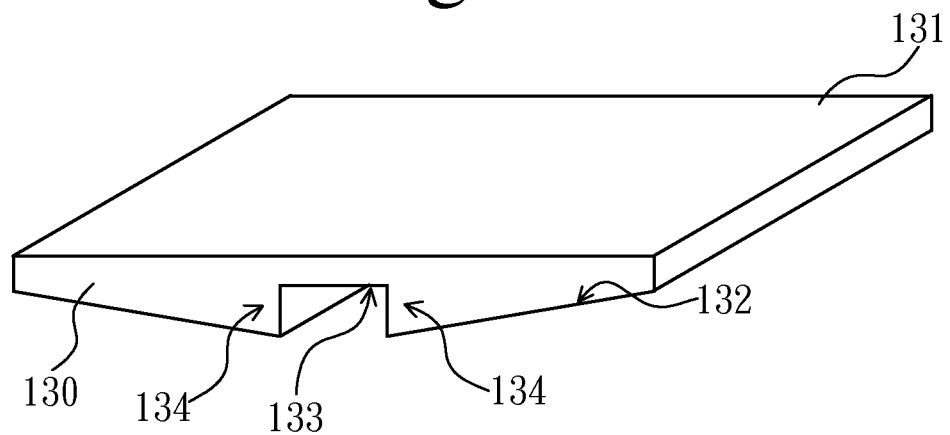
FIG. 2 is a three dimensional view showing a light guide plate according to the first embodiment of the present invention.

Referring to FIG. 2 again, the light guide plate 130 includes a light output surface 131, a bottom surface 132, a recess 133 and two light input surfaces 134. The light output surface 131 is formed on one side of the light guide plate 130 and faces to the liquid crystal display panel 101. The light output surface 131 may include a cloudy surface or a plurality of scattering patterns to uniform light outputted from the light guide plate 130, i.e. the situation of mura is prevented. In one embodiment, the light output surface 131 may include a plurality of protruding structures (not shown) to modify the direction of light, thereby condensing light and enhancing the brightness thereof, wherein the protruding structures may be prism-shaped structures or semicircle-shaped structures. The recess 133 may be positioned at the center of the bottom surface 132 of the light guide plate 130. The bottom surface 132 is separated into two symmetrical inclined surfaces by the recess 133, and thus the center of the light guide plate 130 is thicker than the edges thereof. Therefore, in comparison with a rectangular light guide plate, the light guide plate 130 can be lighter and thinner for reducing the weight of the backlight module 100. The recess 133 can be a rectangular recess. The light input surfaces 134 are formed on two side faces of the recess 133 corresponding to the light sources 120 for allowing the light emitted by the light sources 120 to be inputted in the light guide plate 130. The above-mentioned light input surface 134 may have V-shaped structures (V-cut structures), S-shaped structures or a rough surface structure (not shown) to raise light incidence efficiency and light coupling efficiency.

The backlight module 100 may further comprise a reflective layer or a reflective sheet (not shown) disposed on the bottom surface 132 at both sides of the recess 133. The reflective layer may be made of a highly reflective material, such as Ag, Al, Au, Cr, Cu, In, Ir, Ni, Pt, Re, Rh, Sn, Ta, W, Mn, alloy of any combination thereof, white reflective paint with etiolation-resistant and heat-resistant properties or any combination thereof for reflecting light. The reflective layer or reflective sheet can be also directly formed on the bottom surface 132 at both sides of the recess 133, thereby allowing the bottom surface 132 to be a reflective surface.

Figure 3:
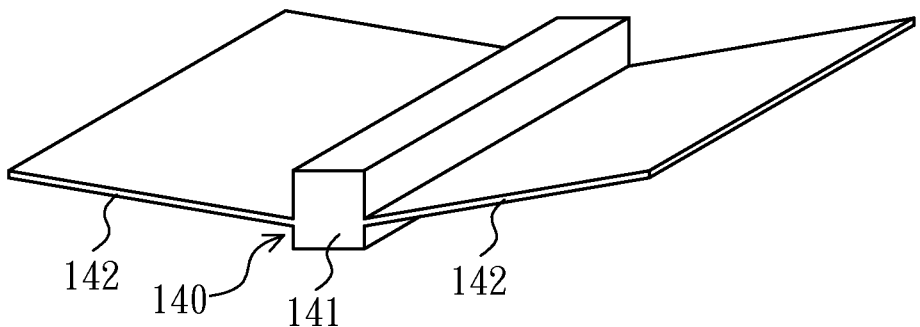
FIG. 3 is a three dimensional view showing a heat dissipation frame according to the first embodiment of the present invention.

Referring to FIG. 3, the heat dissipation frame 140 may be mounted on the back bezel 110 by welding, adhesion or screwing. The heat dissipation frame 140 includes a heat dissipation base 141 and two heat dissipation plates 142. The heat dissipation base 141 and the heat dissipation plates 142 may be made of a metal material with great thermal conductivity, such as Ag, Cu, Cu alloy, Cu—Ag alloy, Al, Al alloy or any alloy thereof, for increasing the heat dissipation efficiency thereof. The heat dissipation base 141 may be a solid metal block (such as Cu block) which is substantially positioned at the center of the back bezel 110 and arranged corresponding to the recess 133 for carrying the light sources 120, wherein at least a portion of the heat dissipation base 141 is received in the recess 133. In this embodiment, the light sources 120 (such as light bars) can be disposed at two opposite sides of the heat dissipation base 141, respectively. Therefore, the light of the light sources 120 is emitted into the light guide plate 130 through the light input surfaces 134 in the recess 133. The heat dissipation plates 142 are disposed at two opposite sides of the heat dissipation base 141 and extend outward from the heat dissipation base 141 for supporting the light guide plate 130. In this embodiment, the heat dissipation plates 142 may be two inclined plates parallel to the bottom surface 132 and have the shape corresponding to the bottom surface 132 of the light guide plate 130. Therefore, the heat dissipation plates 142 and the inclined surface of the light guide plate 130 can allow the light guide plate 130 to be securely supported thereon.

However, in another embodiment, the bottom surface 132 of the light guide plate 130 can also be parallel to the light output surface 131 but not limited to the above description. At this time, the bottom surface 132 may have a plurality of light guiding structures (not shown) formed thereon to guide light to the light output surface 131. The light guiding structures of the bottom surface 132 may be a continuous V-shaped structure, i.e. V-cut structures, a cloudy surface or scattering patterns, thereby guiding the light of the light sources 120 to be outputted from the light output surface 131.

In comparison with the conventional technique, since the light sources 120 of the backlight module 100 are disposed in the recess 133 of the light guide plate 130, the inner surface of the recess 133 can be used to enlarge the area of the heat dissipation base 141 for enlarging the heat dissipation area of the light sources 120. Furthermore, the heat dissipation frame 140 can conduct the heat of the light sources 120 and the light guide plate 130. Accordingly, the backlight module 100 of the present invention can have great heat dissipation effect. Moreover, since the light sources 120 are substantially positioned at the center of the back bezel 110, the temperature distribution of the back bezel 110 can be uniformed for improving the heat dissipation effect of the backlight module 100.

Figure 4:
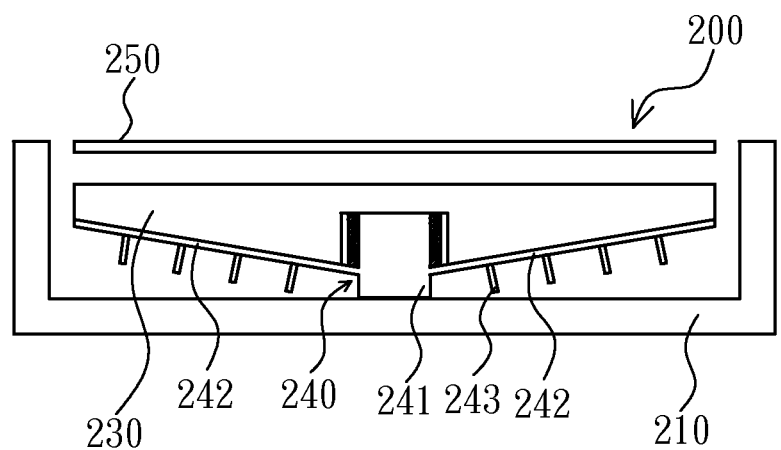
FIG. 4 is a cross-sectional view showing a backlight module according to a second embodiment of the present invention.

Referring to FIG. 4, a cross-sectional view showing a backlight module according to a second embodiment of the present invention is illustrated. Only the difference between the embodiment and the first embodiment will be described hereinafter, and thus the similar portions there-between will be not stated in detail herein. The backlight module 200 comprises a back bezel 210, two light sources 220, a light guide plate 230, a heat dissipation frame 240 and an optical film assembly 250. The heat dissipation frame 240 further includes a heat dissipation base 241, two heat dissipation plates 242 and a plurality of heat sinks 243. The heat dissipation base 241 is substantially positioned at the center of the of the heat dissipation base 241, and the heat dissipation plates 242 are disposed at two opposite sides of the heat dissipation base 241 and extend outward from the heat dissipation base 241. The heat sinks 243 are disposed on a side surface of the heat dissipation plates 242 and adjacent to the back bezel 210. The heat sinks 243 may be formed the heat dissipation plates 242 as one-piece. Alternatively, the heat sinks 243 may be mounted on the bottom surface of the heat dissipation plates 242 by welding or adhesion. Furthermore, in this embodiment, the backlight module 200 may further comprise a heat radiator or a heat dissipation plate (not shown) which is disposed on the bottom surface of the back bezel 210 and corresponding to heat dissipation base 241 for dissipating the heat of the heat dissipation base 241 and facilitating the heat dissipation of the backlight module 200.

Figure 5:
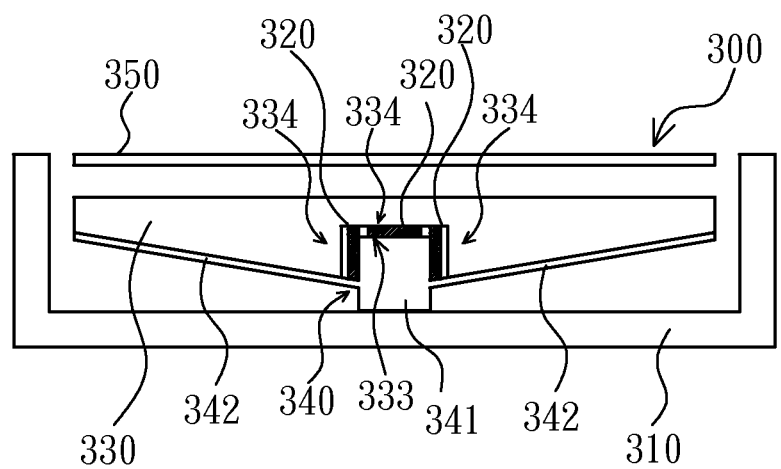
FIG. 5 is a cross-sectional view showing a backlight module according to a third embodiment of the present invention.

Referring to FIG. 5, a cross-sectional view showing a backlight module according to a third embodiment of the present invention is illustrated. Only the difference between the third embodiment and the first embodiment will be described hereinafter, and thus the similar portions there-between will be not stated in detail herein. The backlight module 300 of the third embodiment comprises a back bezel 310, three light sources 320, a light guide plate 330, a heat dissipation frame 340 and an optical film assembly 350. The heat dissipation frame 340 includes a heat dissipation base 341 and two heat dissipation plates 342. The light sources 320 (such as light bars) may be disposed on two opposite sides and a top surface of the heat dissipation base 341. At this time, the light sources 320, which are disposed in the recess 333, can emit light into the light guide plate 330 through the light input surface 334.

As described above, the light sources of the backlight module are disposed in the recess of the light guide plate, and thus the inner surface of the recess can be used to enlarge the area of the heat dissipation base for enlarging the heat dissipation area of the light sources. Moreover, the heat dissipation frame can conduct the heat of the light guide plate, and thus the backlight module of the present invention can have great heat dissipation effect. Besides, since the light sources are substantially positioned at the center of the back bezel, the temperature distribution of the back bezel can be uniformed, and the light leakage problem on the edge can be prevent. By improving the heat dissipation effect, the life time of the back-light sources can be extended, and the display quality of the display apparatus can be improved.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A backlight module comprising:
   at least one light source;
   a light guide plate including a light output surface and a bottom surface opposite to the light output surface, wherein the bottom surface of the light guide plate has a recess, and the at least one light source is disposed in the recess, and the bottom surface is separated into two symmetrical inclined surfaces by the recess;
   a heat dissipation frame including a heat dissipation base and two heat dissipation plates, wherein the heat dissipation base is disposed corresponding to the recess for supporting the at least one light source and dissipating the heat of the at least one light source, and the heat dissipation plates are disposed at two opposite sides of the heat dissipation base for supporting the light guide plate and dissipating the heat of the light guide plate, and the heat dissipation plates are two inclined plates parallel to the bottom surface of the light guide plate; and
   a back bezel configured to carry the light guide plate, the at least one light source and the heat dissipation frame,
   wherein the at least one light source comprises three light sources, and the three light sources are disposed at two opposite sides and a top surface of the heat dissipation base.

2. A backlight module comprising:
   at least one light source;
   a light guide plate including a light output surface and a bottom surface opposite to the light output surface, wherein the bottom surface of the light guide plate has a recess, and the at least one light source is disposed in the recess;
   a heat dissipation frame configured to support the light guide plate and the light source, and to dissipate the heat of the light guide plate and the at least one light source; and
   a back bezel configured to carry the light guide plate, the at least one light source and the heat dissipation frame,
   wherein the heat dissipation frame includes a heat dissipation base, the at least one light source comprises three light sources, and the three light sources are disposed at two opposite sides and a top surface of the heat dissipation base.

3. The backlight module according to claim 2, wherein the heat dissipation frame includes two heat dissipation plates, and the heat dissipation base is disposed corresponding to the recess, and the heat dissipation plates are disposed at two opposite sides of the heat dissipation base.

4. The backlight module according to claim 3, wherein the heat dissipation base and the heat dissipation plates are made of a metal material with great thermal conductivity.

5. The backlight module according to claim 2, wherein the recess is positioned at the center of the bottom surface.

6. The backlight module according to claim 5, wherein a reflective layer or a reflective sheet is disposed on the bottom surface at both sides of the recess.

7. The backlight module according to claim 3, wherein the heat dissipation frame further includes a plurality of heat sinks disposed on a side surface of the heat dissipation plates and adjacent to the back bezel.

8. A display apparatus, comprising:
   a display panel; and
   a backlight module comprising:
   at least one light source;
   a light guide plate including a light output surface and a bottom surface opposite to the light output surface, wherein the bottom surface of the light guide plate has a recess, and the at least one light source is disposed in the recess;
   a heat dissipation frame configured to support the light guide plate and to dissipate the heat of the light guide plate and the at least one light source; and
   a back bezel configured to carry the light guide plate, the at least one light source and the heat dissipation frame,
   wherein the heat dissipation frame includes a heat dissipation base, the at least one light source comprises three light sources, and the three light sources are disposed at two opposite sides and a top surface of the heat dissipation base.

9. The display apparatus according to claim 8, wherein the heat dissipation frame includes two heat dissipation plates, and the heat dissipation base is disposed corresponding to the recess, and the heat dissipation plates are disposed at two opposite sides of the heat dissipation base.

10. The display apparatus according to claim 9, wherein the heat dissipation base and the heat dissipation plates are made of a metal material with great thermal conductivity.

11. The display apparatus according to claim 9, wherein the bottom surface of the light guide plate is separated into two symmetrical inclined surfaces, and the heat dissipation plates are two inclined plates parallel to the bottom surface of the light guide plate.

12. The display apparatus according to claim 8, wherein a reflective layer or a reflective sheet is disposed on the bottom surface at both sides of the recess.

13. The display apparatus according to claim 9, wherein the heat dissipation frame further includes a plurality of heat sinks disposed on a side surface of the heat dissipation plates and adjacent to the back bezel.

14. The display apparatus according to claim 8, wherein the recess is positioned at the center of the bottom surface.

* * * * *